United States Patent
Lieu et al.

(10) Patent No.: US 8,586,407 B2
(45) Date of Patent: Nov. 19, 2013

(54) METHOD FOR DEPACKAGING PREPACKAGED INTEGRATED CIRCUIT DIE AND A PRODUCT FROM THE METHOD

(75) Inventors: Peter Lieu, Irvine, CA (US); W. Eric Boyd, La Mesa, CA (US)

(73) Assignee: ISC8 Inc., Costa Mesa, CA (US)

( * ) Notice: Subject to any disclaimer, the term of this patent is extended or adjusted under 35 U.S.C. 154(b) by 255 days.

(21) Appl. No.: 13/230,369

(22) Filed: Sep. 12, 2011

(65) Prior Publication Data

US 2012/0068341 A1   Mar. 22, 2012

Related U.S. Application Data

(60) Provisional application No. 61/492,660, filed on Jun. 2, 2011, provisional application No. 61/403,519, filed on Sep. 17, 2010.

(51) Int. Cl.
*H01L 21/00* (2006.01)

(52) U.S. Cl.
USPC .......................................................... 438/106

(58) Field of Classification Search
None
See application file for complete search history.

(56) References Cited

U.S. PATENT DOCUMENTS 7,315,070 B2 * 1/2008 Okada et al. .................. 257/415

* cited by examiner

*Primary Examiner* — Charles Garber
*Assistant Examiner* — Andre' C Stevenson
(74) *Attorney, Agent, or Firm* — W. Eric Boyd, Esq.

(57) ABSTRACT

A method for providing a known good integrated circuit die having enhanced planarity from a prepackaged integrated circuit die having a surface warpage such as in a ball grid array (BGA) package is provided. A partially-depackaged integrated circuit package is affixed to a substrate with a spacer element there between such that the active surface of the die within the partially depackaged integrated circuit die is "bowed" slightly upwardly to define a convex surface. The exposed encapsulant on the now-convex surface of the mounted, partially-depackaged integrated circuit package is then lapped or ground away to a predetermined depth so that an integrated circuit die is provided having an enhanced planarity and surface uniformity.

19 Claims, 2 Drawing Sheets

METHOD FOR DEPACKAGING PREPACKAGED INTEGRATED CIRCUIT DIE AND A PRODUCT FROM THE METHOD

CROSS-REFERENCE TO RELATED APPLICATIONS

This application claims the benefit of U.S. Provisional Patent Application No. 61/492,660, filed on Jun. 2, 2011 entitled "Method of De-Packaging Warped Die for Stacking" and U.S. Provisional Patent Application No. 61/403,519, filed Sep. 17, 2010 entitled "De-Packaging Warped Die for Stacking", pursuant to 35 USC 119, which applications are incorporated fully herein by reference.

STATEMENT REGARDING FEDERALLY SPONSORED RESEARCH AND DEVELOPMENT

This invention was made with United States Government support under Contract No. 2009-1113120-000 awarded by a proprietary agent of the United States Government.

The United States Government has certain rights in the invention.

BACKGROUND OF THE INVENTION

1. Field of the Invention

This invention relates to the dense packaging of electronic circuitry and to the stacking of semiconductor integrated circuit (IC) chips also referred to as "die" or "integrated circuit die" herein. More specifically, the invention relates to a process for de-packaging warped integrated circuit die in a prepackaged integrated circuit to correct planarity imperfections to provide enhanced uniformity in the final die for use in IC stacking applications.

The invention is an enabling technology for providing a substantially planar integrated circuit die for use in the fabrication of a "neo-layer" and "neo-wafer".

2. Description of the Related Art

The ability to fabricate very thin, stackable layers containing one or a plurality of homogeneous or heterogeneous integrated circuit chips is desirable and allows high density, high speed electronic systems to be assembled for use in military, space, security and other applications.

Examples of such layers and modules are disclosed in U.S. Pat. No. 6,072,234, entitled Stack of Equal Layer Neo-Chips Containing Encapsulated IC Chips of Different Sizes, U.S. Pat. No. 6,797,537, Method of Making Stackable Layers Containing Encapsulated Integrated Circuit Chips With One or More Overlying Interconnect Layers, U.S. Pat. No. 6,784,547, Stackable Layers Containing Encapsulated Integrated Circuit Chips With One or More Overlying Interconnect Layers, U.S. Pat. No. 6,117,704, Stackable Layer Containing Encapsulated Chips, U.S. Pat. No. 6,072,234, Stack of Equal Layer Neo-Chips Containing Encapsulated IC Chips of Different Sizes, U.S. Pat. No. 5,953,588, Stackable Layers Containing Encapsulated IC Chips, and U.S. Pat. No. 7,768,113, entitled Stackable Tier Structure Comprising Prefabricated High Density Feed-through.

The stacking and interconnection of very thin microelectronic layers permits high circuit speeds in part because of short lead lengths with related reduced parasitic impedance and reduced electron time-of-flight. These desirable features combined with a very high number of circuit and layer interconnections allow relatively large I/O designs to be implemented in a small volume.

The present invention provides a stackable integrated circuit die having an enhanced planarity and uniformity for use in multi-layer, microelectronic modules such as are disclosed in the above referenced patents which permit die having different functions and therefore different areas to be stacked as if they were same size die.

A prior art process for making a "neo-chip" or "neo-layer" involves the "potting" of individual IC chips in a encapsulant or compound which supports and insulates each chip and which can be cut or diced to provide equal area layers so that chips having different sizes can be stacked in layers whose edges are coplanar with one another. The individual chips, in die form, may be incorporated into neo-wafer form for processing. Thereafter, layers are cut out of the neo-wafer and incorporated into stacks.

The prior art neo-layer processes may include the processing and stacking of chips purchased as individual die. Beneficially, chips purchased as individual die are generally "known good" die, which have been "burned in", and are therefore pre-tested prior to stacking.

Prior to stacking, one or more known good die are used to create the "neo-wafer", by locating those known good die in a potting fixture. Potting material is flowed into the fixture, which is enclosed and then the potting material is cured. The resulting "neo-wafer" is removed from the fixture and then subjected to pre-stacking process steps, including spinning on a layer of dielectric material, forming vias through that material to reach the terminals on the die in the wafer, and then forming electrical conductors on the surface of the dielectric layer leading from the die terminals. Thereafter the neo-wafer is diced into one or more layers suitable for stacking, each layer containing at least one of the known good die.

Each layer of a completed stack has electrical leads which connect the IC circuitry of the embedded chip or chips to one or more access planes, where the electrical leads are available for connection to exterior circuitry.

Major cost-saving benefits can be obtained by the sole use of "known good" die, and the use of a neo-wafer in processing one or more of such die.

Neo-stacking offers significant improvements over bare silicon die stacking, but it also proved troublesome under certain market circumstances. In particular, it is often difficult to obtain bare die because many manufacturers will only sell packaged die.

For instance, when trying to buy bare DRAM die from a particular manufacturer, it was discovered that the manufacturer would not sell bare DRAM die, but would sell the DRAM die already pre-tested and installed in prepackaged integrated circuit packages.

Because of the demand for die and the high capital investment necessary to be a mass manufacturer of them, it is difficult to induce a mass fabricator of die to supply only die as opposed to the usual finished product which is a packaged or encapsulated integrated circuit chip. Such mass fabricators are typically fully occupied with the manufacture of finished and packaged integrated circuits. Individual IC chips are not typically offered for sale either in wafer or in die form.

Even in those cases where a mass fabricator can be induced to manufacture and sell a bare functional die, the die may only be supplied in wafers or diced without testing. In other words, a die is normally tested after it is connected to its lead frame and packaged to ascertain whether it is operable as intended. Mass testing of bare die is not a procedure that many mass fabricators are equipped or even inclined to do. Therefore, a purchaser of bare die must test each die individually in order to determine its operability or the yield. Bare die testing is too limited to ensure acceptable yields, while comprehensive testing and burn-in renders bare die production cost-ineffective. These problems are sometimes referred to as the known good die or KGD problem.

Because prepackaged parts are burned in and therefore contain known good die, it is sometimes desirable or necessary to depackage the known good die within a prepackaged IC package for use in certain applications such as the above neo-processes.

A present concern in providing KGD from de-packaged IC chips is the observation that certain types of thinner IC chips (less than 250 microns thick) are provided with a non-uniform planarity, i.e., are warped inside the package encapsulant material whereby the active surface area of the IC chip having electronic circuitry defined thereon is concave.

A difficulty arises when depackaging prepackaged integrated circuit die (such as by grinding or lapping away a predetermined portion of encapsulant on the upper and lower surface of the prepackaged part) in that the die within the package may be warped across its surface. In such cases, the lapping or grinding process steps can result in the removal of an operable portion of the chip itself (i.e., the active surface of the integrated circuit die), a feature that is undesirable for use in neo-layers.

The warped die condition is due to IC package fabrication processes with the result being that the upper, active surface of the die in, for instance, a ball grid array package material is slightly concave, i.e., warped, which warped condition is exacerbated as the encapsulating material is progressively removed during depackaging.

Applicant has observed conditions in which the ends of prepackaged die are approximately 35 to 45 microns above the internal package substrate while the center of die is approximately 15 microns above the substrate. Non-planarity or warpage has been measured in some packages with a difference of about 50 microns from the end of the die to its center, which is unacceptable in certain die stacking applications.

Because of the above-described integrated circuit package conditions, processes such as grinding and lapping to depackage (i.e., to remove encapsulant material) the die can worsen the final die thickness uniformity, sometimes resulting in removal of the active IC semiconductor material from the die before the desired final die thickness is achieved.

What is needed is a method whereby known good die can be economically and practically obtained from packaged known good die and that have enhanced planarity and surface uniformity.

BRIEF SUMMARY OF THE INVENTION

A method for providing a tested and burned-in, known good integrated circuit die having an enhanced planarity from a prepackaged integrated circuit die such as a thin small outline package (TSOP) or a ball grid array (BGA) package is provided. A product from the process of the invention is also disclosed.

Predetermined portions of a prepackaged integrated circuit die packaging, encapsulant material, lead-frame, and wire bond connection structures are removed such as by dicing saw, lapping, grinding or a combination thereof to define a partially-depackaged integrated circuit die package.

In one embodiment of the invention, a spacer element having a predetermined thickness and predetermined set of surface dimensions is affixed to a substantially planar substrate such as a quartz substrate. The partially-depackaged integrated circuit die package is affixed to the substrate with the spacer element disposed between the substrate and the partially-depackaged integrated circuit die package such that the active surface of the die within the partially-depackaged integrated circuit die package is "bowed", slightly upwardly, i.e., is convex with respect to the surface of the substrate.

The exposed encapsulant material on the surface of the mounted, partially-depackaged integrated circuit die package is then lapped or ground away to a predetermined depth so that a known good integrated circuit die is provided having an enhanced planarity and surface uniformity.

In a first aspect of the invention, a process for providing an integrated circuit die having improved planar uniformity from a prepackaged integrated circuit package is disclosed comprising the steps of providing a prepackaged integrated circuit package comprising an integrated circuit die, removing a predetermined portion of the package in a first operation to define a partially-depackaged integrated circuit die, affixing the partially-depackaged integrated circuit die and a spacer element having a predetermined thickness and a predetermined set of surface dimensions to a substrate whereby at least a portion of the spacer element is disposed between the partially-depackaged integrated circuit die and the substrate to define a convex, partially-depackaged integrated circuit die surface and removing a predetermined portion of the material to a predetermined depth from the convex, partially-depackaged integrated circuit die surface in a second operation.

In a second aspect of the invention, the prepackaged integrated circuit package may comprise a ball grid array package.

In a third aspect of the invention, the spacer element may comprise a polyimide film material.

In a fourth aspect of the invention, the substrate may comprise a quartz substrate.

In a fifth aspect of the invention, the predetermined portion of the convex, partially-depackaged integrated circuit die may be removed by a lapping or grinding operation.

In a sixth aspect of the invention, the partially depackaged integrated circuit die may be affixed to the substrate by means of a thermal wax.

In an eighth aspect of the invention a known good die fabricated from a prepackaged integrated circuit is disclosed that is prepared by a process comprising the steps of providing a prepackaged integrated circuit package comprising an integrated circuit die, removing a predetermined portion of the package in a first operation to define a partially-depackaged integrated circuit die, affixing the partially-depackaged integrated circuit die and a spacer element having a predetermined thickness and a predetermined set of surface dimensions to a substrate whereby at least a portion of the spacer element is disposed between the partially-depackaged integrated circuit die and the substrate to define a convex, partially-depackaged integrated circuit die surface, and removing a predetermined portion of the material to a predetermined depth from the convex, partially-depackaged integrated circuit die surface in a second operation.

In a ninth aspect of the invention prepared by the process, the prepackaged integrated circuit package is a ball grid array package.

In a tenth aspect of the invention prepared by the process, the spacer element is a polyimide film material.

In an eleventh aspect of the invention prepared by the process, the substrate is quartz substrate.

In a twelfth aspect of the invention prepared by the process, the predetermined portion of the convex, partially-depackaged integrated circuit die is removed by a lapping or grinding operation.

In a thirteenth aspect of the invention prepared by the process, the partially depackaged integrated circuit die is affixed to the substrate by means of a thermal wax.

In a fourteenth aspect of the invention prepared by the process, the partially depackaged integrated circuit die is a known good die.

In a fifteenth aspect of the process of the invention, a process for providing an integrated circuit die having improved planar uniformity is disclosed comprising the steps of providing an integrated circuit die having an encapsulant material on its surface, affixing the integrated circuit die to a substrate whereby a convex integrated circuit die surface is defined and removing a predetermined portion of the convex integrated circuit die surface. The surface may be the active surface or inactive surface of the die. The convex surface may be defined by a shim or spacer element having a predetermined thickness and predetermined set of surface dim or by a predetermined surface characteristic of a substrate such as an elevated or offset surface area of the substrate surface.

These and various additional aspects, embodiments and advantages of the present invention will become immediately apparent to those of ordinary skill in the art upon review of the Detailed Description and any claims to follow.

While the claimed apparatus and method herein has or will be described for the sake of grammatical fluidity with functional explanations, it is to be understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112, are to be accorded full statutory equivalents under 35 USC 112.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE INVENTION

Turning now to the figures wherein like numerals define like elements among the several views, a process for depackaging a prepackaged integrated circuit die and a product provided by the process is disclosed.

Irvine Sensors Corporation, assignee of the instant application, stacks heterogeneous and homogeneous bare integrated circuit die and modified integrated circuit die in many configurations for use in a variety of applications. Processing integrated circuit die for stacking (lamination) may be performed with integrated circuit chips that are received at wafer level, at die level or, preferably, at the packaged level because the latter package level parts are provided "burned in" and pre-tested at a "known good die" level.

In some IC stacking applications, the total IC stack height may be limited to a height that requires individual die to be very thin. In this instance, the use of prepackaged IC chips requires the encapsulated IC chips to be "depackaged" by removing the encapsulant material, internal lead frame and elements other than the IC chip itself before the IC chips can be stacked.

In order to save space and material, the semiconductor industry has been packaging thinner and thinner IC chips in thinner and thinner packages. It has been observed that certain types of thinner integrated circuit die in ball grid array packages ("BGA"s) are less than 250 microns thick and are warped inside the package encapsulant material with the active IC surface area becoming concave.

Because of the above described concave condition, grinding and lapping to depackage such die worsens the final die thickness uniformity; sometimes resulting in the undesirable removal of semiconductor material from the die itself before the required die thickness is achieved.

In order to overcome the deficiencies in the planar uniformity of integrated circuit die in prepackaged parts that are depackaged for use in IC die stacking applications, the invention discloses a process to address the packaged die warping problem by using a set of lapping process steps and discloses a product made from the process.

Figure 1:
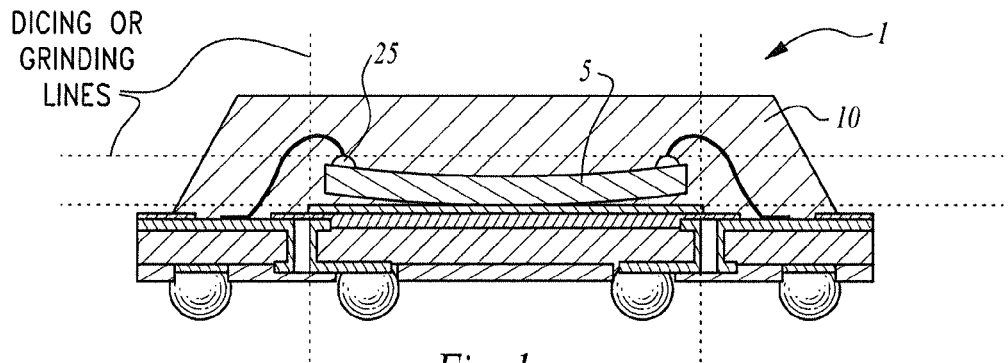
FIG. 1 is cross-section of a ball grid array package depicting an encapsulated IC chip or die having a warped condition.
Figure 2:
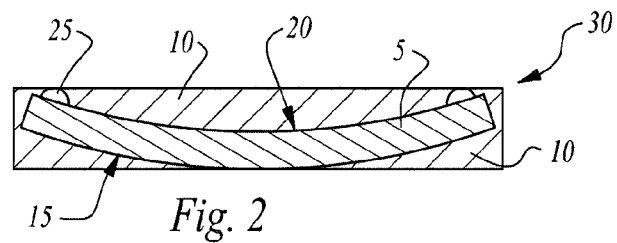
FIG. 2 depicts the partially-depackaged integrated circuit die after predetermined portions of the ball grid array package have been removed.

A preferred embodiment of the process of the invention comprises the steps as follows:

As depicted in FIGS. 1 and 2, a prepackaged integrated circuit chip package such as a ball grid array package 1 is provided having an integrated circuit die 5 depicting an exaggerated warped or concave condition within the package encapsulant material 10. Predetermined portions of contact leads, lead frame elements, wire bond connections or package structures extending beyond the periphery of the die 5 within the package are first removed such as by a dicing saw, grinder or other suitable means, for instance along predetermined dicing or grinding lines as is known in the semiconductor packaging arts.

The package encapsulant material 10 on the inactive surface 15 of the integrated circuit die 5 that is opposite active surface 20 of the integrated circuit die 5 may be ground and/or lapped off until the inactive silicon or semiconductor material on the inactive surface 15 of die 5 is exposed to establish a reference plane for subsequent grinding and/or lapping process steps.

The package encapsulant material 10 on the active surface 20 of integrated circuit die 5 may be ground and/or lapped away until the metal contacts 25 on the bond pads of integrated circuit die 5 are exposed so that a partially-depackaged integrated circuit die 30 is defined as depicted in FIG. 2.

At this point, the partially-depackaged integrated circuit die 30 thickness is somewhat larger than the final desired thickness and there is still package encapsulant material 10 remaining on the active die surface 20 that may be removed without damaging the active circuitry thereon using the method of the invention.

Figure 3:
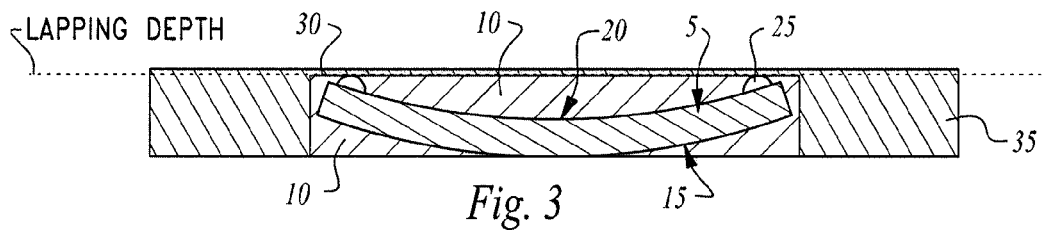
FIG. 3 is a partially-depackaged integrated circuit die that has been potted in an encapsulant.

The partially-depackaged integrated circuit die 30 is next preferably potted using a suitable potting material or compound 35 (such as silica-filled epoxy encapsulants) by adding sufficient potting material or compound such that the entirety of the partially-depackaged integrated circuit die 30 is encapsulated by and within the potting material or compound 35 such as depicted in FIG. 3.

A predetermined portion of the bottom inactive surface 15 of the now-potted and partially-depackaged integrated circuit die 30 is then ground or lapped until the potted "wafer" is of a predetermined thickness for handling purposes as well at to establish a reference plane.

The above process step is next followed by lapping the active surface 20 of the potted wafer to a predetermined depth such as until the edges of the concave surface of the integrated circuit die 5 are visible and almost, but not quite, exposed through the remaining encapsulant material 10 as seen in FIG. 3.

Figure 4:
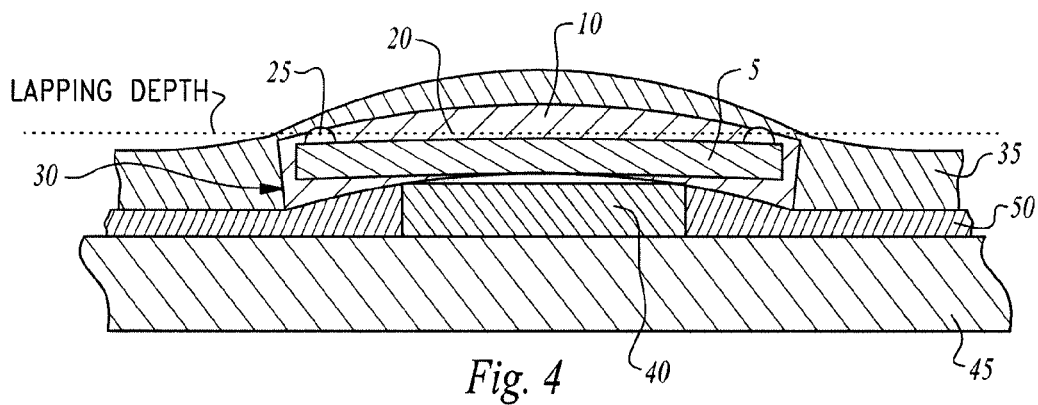
FIG. 4 depicts a cross-section of the partially-depackaged integrated circuit die mounted on a planar substrate with a spacer element disposed there between to define a convex surface of the partially-depackaged integrated circuit die.
Figure 5:
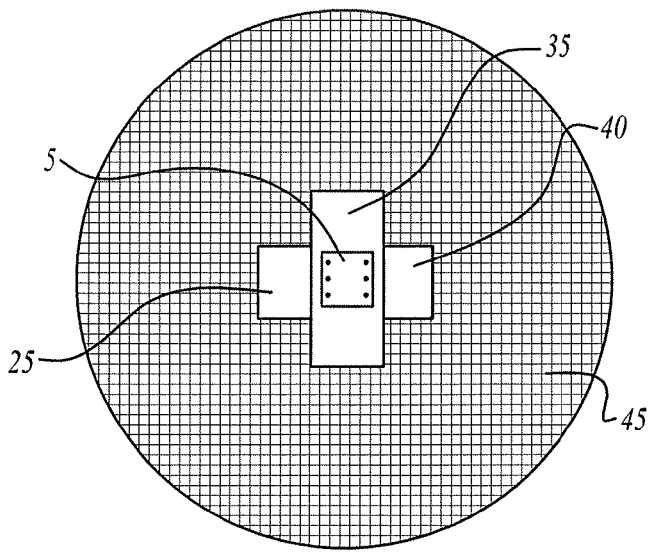
FIG. 5 is a plan view of the partially-depackaged integrated circuit die mounted on a planar substrate with a spacer element disposed there between to define a convex surface of the partially-depackaged integrated circuit die.
Figure 6:
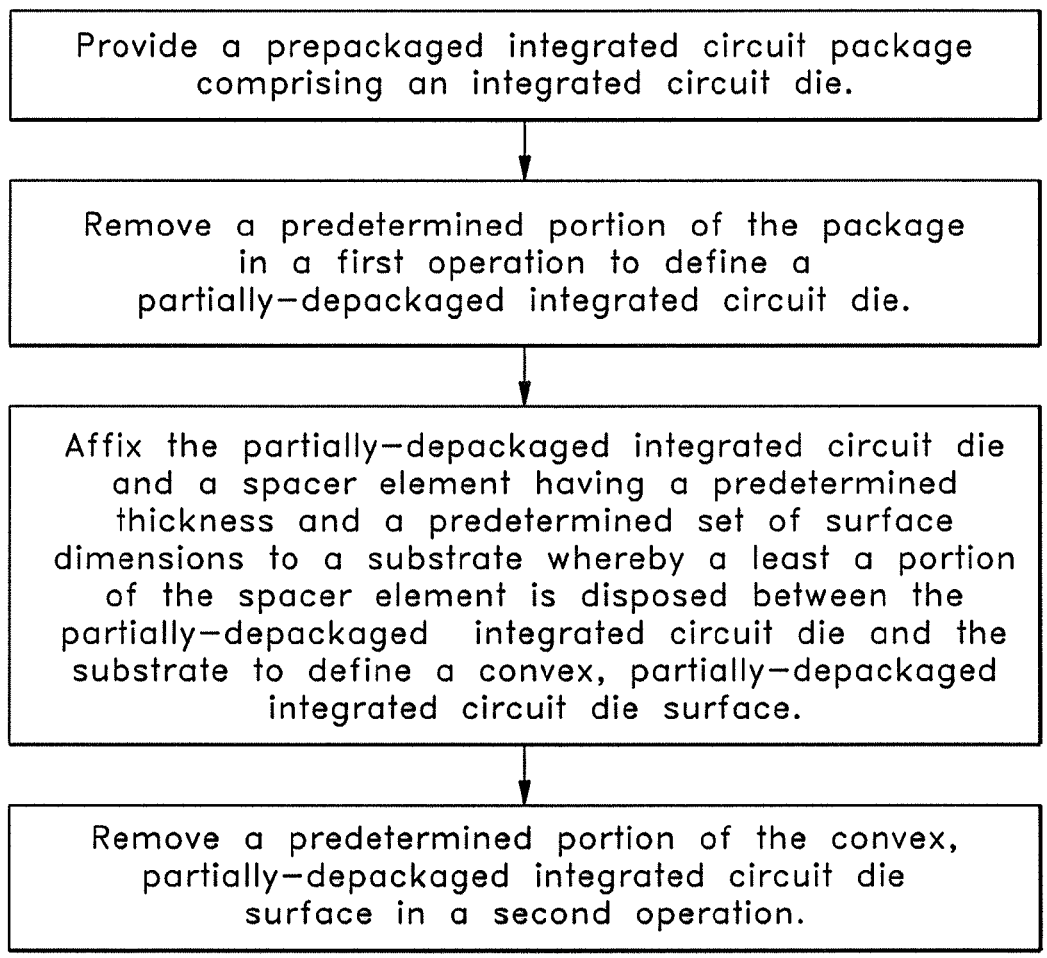
FIG. 6 is a set of process steps for providing a depackaged integrated circuit die having enhanced planarity and surface uniformity.

Turning now to FIGS. 4 and 5, to remove additional package encapsulant material 10 from the concave center of the active surface 20 of the integrated circuit die 5 and to provide a final uniform die thickness, a spacer element 40 having a predetermined thickness and a predetermined set of surface dimensions is bonded to a substrate 45 having a substantially planar surface such as a quartz substrate.

The spacer element 40 may comprise a small section of polymer or polyimide film such as a KAPTON tape material available from DUPONT that is approximately 0.005" thick that is disposed between the partially-depackaged integrated circuit die 30 inactive surface 15 and the quartz substrate 45.

The partially-depackaged integrated circuit die 30 is preferably press-mounted with a thermal wax 50 on the surface of the planar quartz substrate 45. The disposition of the spacer element 40 under the center portion of the partially-depackaged integrated circuit die 30 urges the die 5 center slightly upward just beyond a planar condition whereby the active surface 20 of die 5 is planar or slightly convex with respect to the planar surface of the quartz substrate 45.

The exposed surface of the partially-depackaged integrated circuit die 30 is next lapped to a predetermined depth such as until the metal contacts 25 of the die are exposed or removed. At this point, the semiconductor die material may be visible through the potting compound 35.

At this stage of the process steps of the invention, the depackaged integrated circuit die 5 has an enhanced planarity and thickness uniformity and may be demounted from the quartz substrate 45.

If desired, the depackaged integrated circuit die 5 may be demounted from the quartz substrate 45, turned over and remounted on quartz substrate 45 as above with spacer element 40 disposed between substrate 45 and depackaged integrated circuit die 5 so that the inactive surface 15 of die 5 is planar or slightly convex with respect to the planar surface of the quartz substrate 45. The inactive surface of depackaged integrated circuit die 5 may then be lapped or ground to a predetermined depth in a separate operation as above for enhanced surface uniformity and planarity.

The resultant die thickness of the above process steps is substantially uniform, although may be somewhat thinner in the center than at the ends, but the overall potted assembly has considerably improved planar uniformity so as to permit it to be used in die stacking applications such as neo-layer and neo-wafer applications with high yields.

If there is need to reroute die electrical bond pads or contacts on the die, reroute process steps may be performed at the final post-lapping level (potted and thinned wafer assembly) prior to dicing to final dimensions.

Dicing to final dimensions may then be performed using a conventional dicing saw or equivalent means to provide a die with required dimensions and with improved planarity ready for die stacking applications.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a sub combination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

We claim:

1. A process for providing an integrated circuit die having improved planar uniformity from a prepackaged integrated circuit package comprising the steps of:
   providing a prepackaged integrated circuit package comprising an integrated circuit die,
   removing a predetermined portion of the package in a first operation to define a partially-depackaged integrated circuit die,
   affixing the partially-depackaged integrated circuit die and a spacer element having a predetermined thickness and a predetermined set of surface dimensions to a substrate whereby at least a portion of the spacer element is disposed between the partially-depackaged integrated circuit die and the substrate to define a convex, partially-depackaged integrated circuit die surface, removing a predetermined portion of the convex, partially-depackaged integrated circuit die surface in a second operation.

2. The method of claim 1 wherein the prepackaged integrated circuit package is a ball grid array package.

3. The method of claim 1 wherein the spacer element is a polyimide film material.

4. The method of claim 1 wherein the substrate is quartz substrate.

5. The method of claim 1 wherein the predetermined portion of the convex, partially-depackaged integrated circuit die is removed by a lapping or grinding operation.

6. The method of claim 1 wherein the partially depackaged integrated circuit die is affixed to the substrate by means of a thermal wax.

7. The method of claim 1 wherein the prepackaged integrated circuit die is a known good die.

8. A depackaged die fabricated from a prepackaged integrated circuit prepared by a process comprising the steps of:

providing a prepackaged integrated circuit package comprising an integrated circuit die, removing a predetermined portion of the package in a first operation to define a partially-depackaged integrated circuit die, affixing the partially-depackaged integrated circuit die and a spacer element having a predetermined thickness and a predetermined set of surface dimensions to a substrate whereby at least a portion of the spacer element is disposed between the partially-depackaged integrated circuit die and the substrate to define a convex, partially-depackaged integrated circuit die surface, removing a predetermined portion of the convex, partially-depackaged integrated circuit die surface in a second operation.

9. The depackaged die of claim 8 wherein the prepackaged integrated circuit package is a ball grid array package.

10. The depackaged die of claim 8 wherein the spacer element is a polyimide film material.

11. The depackaged die of claim 8 wherein the substrate is quartz substrate.

12. The depackaged die of claim 8 wherein the predetermined portion of the convex, partially-depackaged integrated circuit die is removed by a lapping or grinding operation.

13. The depackaged die of claim 8 wherein the partially depackaged integrated circuit die is affixed to the substrate by means of a thermal wax.

14. The depackaged die of claim 8 wherein the prepackaged integrated circuit die is a known good die.

15. A process for providing an integrated circuit die having improved planar uniformity comprising the steps of:

providing an integrated circuit die having an encapsulant material on its surface, affixing the integrated circuit die to a substrate whereby a convex integrated circuit die surface is defined, and, removing a predetermined portion of the convex integrated circuit die surface.

16. The process of claim 15 wherein the surface is an active surface of the die.

17. The process of claim 15 wherein the surface is an inactive surface of the die.

18. The process of claim 15 wherein the convex integrated die surface is defined by a spacer element.

19. The process of claim 15 wherein the convex integrated die surface is defined by a predetermined surface characteristic of the substrate.

* * * * *